United States Patent [19]

Chou et al.

[11] Patent Number: 4,985,321
[45] Date of Patent: Jan. 15, 1991

[54] THERMAL MASS TRANSFER OF METALLIC IMAGES

[75] Inventors: Hsin-Hsin Chou, Woodbury; William M. Lamanna, Stillwater; Robin E. Wright, Inver Grove Heights, all of Minn.

[73] Assignee: Minnesota Mining and Manufacturing Company, St. Paul, Minn.

[21] Appl. No.: 427,042

[22] Filed: Oct. 25, 1989

Related U.S. Application Data

[63] Continuation-in-part of Ser. No. 283,596, Dec. 13, 1988, Pat. No. 4,892,798.

[51] Int. Cl.$^5$ ............................................. G03G 13/10
[52] U.S. Cl. ..................................... 430/38; 430/119; 430/126
[58] Field of Search ........................... 430/119, 126, 38

[56] References Cited

U.S. PATENT DOCUMENTS

| | | | |
|---|---|---|---|
| 4,245,026 | 1/1981 | Ziolo | 430/137 |
| 4,252,672 | 2/1981 | Smith | 252/430 |
| 4,252,675 | 2/1981 | Smith | 252/430 |
| 4,272,596 | 6/1981 | Harbour et al. | 430/37 |
| 4,525,671 | 2/1981 | Smith | 252/430 |
| 4,576,725 | 3/1986 | Miura et al. | 252/62.51 |
| 4,599,184 | 7/1986 | Nakatani et al. | 252/62.51 |
| 4,800,395 | 1/1989 | Balzano et al. | 343/895 |
| 4,800,397 | 1/1989 | Afzali-Ardakani et al. | 346/1.1 |
| 4,871,790 | 10/1989 | Lamanna | 523/333 |
| 4,892,798 | 1/1990 | Lamanna et al. | 430/119 |

OTHER PUBLICATIONS

Klabunde, K, et al., *Proc. SPIE-Int. Soc. Opt. Eng.* 821, 206-213 (1988).
Klabunde, K., et al., *Langmuir* 2, 259-260 (1986).
Klabunde, K., et al. *ACS Symposium Series*, 333 (High Energy Processes Organomet. Chem.) 246-59 (1987).
Schaffert, R. M., "*Electrophotography*", The Focal Press, New York, pp. 562-574 (1975).
Turkevich, J., *J. Gold Bull*, 18, 86-91 and 125-131 (1985).
Hirai, H., et al., *J. Macromol. Sci.-Chem.* A13, 663-649 and 727-750 (1979).
Klabunde, K. et al., *Langmuir* 3, 986-992 (1987).
Kimura, et al., *Bull Chem. Soc. Jpn.* 56, 3578-3584 (1983); 57, 1683-84 (1984).
Ozin and Andrews, *J. Phys. Chem.*, 90, 2929-2938 (1986).
Buske, N., Colloids and Surfaces 12, 195-202 (1984).
Shimoiizaka, J., et al., *Fine Part. Process.*, Proc. Int. Symp., Samasundaran, P.Ed., AIME: New York 1980, pp. 1310-1324.
Papirer, E., et al., *J. Colloid and Interface Sci.* 1983, 94, 207-219 and 220-228.
Kilner, M., et al., *IEEE Transactions on Magnetics* 1984, 20, 1735-1737.
Hoon, S. R., et al., *J. Magn. Magn. Mater.* 1983, 39, 107-110.
Nakatani, I., et al., *J. Magn. Magn. Mater.* 65, 261-264 (1987).
OEP, Sep. 1988, pp. 58-60.

*Primary Examiner*—John Goodrow
*Attorney, Agent, or Firm*—Donald M. Sell; Walter N. Kirn; Lorraine R. Sherman

[57] ABSTRACT

The present invention provides a process for thermal mass transfer of metallic images, the process comprising the steps of
 (a) providing
  (1) a toner fluid dispersion comprising electrostatically charged, colloidal elemental metal particles dispersed in an electrically nonconductive organic carrier liquid and an amount of a soluble surfactant effective to charge and stabilize said dispersion,
  (2) a dielectric or photoconductive substrate, and
  (3) a thermoplastic receptor substrate,
 (b) electrophoretically depositing the charged colloidal elemental metal particles of the toner fluid in a uniform or imagewise fashion on the dielectric or photoconductive substrate using standard electrographic techniques to provide a donor substrate bearing an electrically nonconductive, colloidal, elemental metal coating thereon;
 (c) transferring, by application of energy, said metal coating from said donor substrate to said thermoplastic receptor substrate, to provide a metallic image on said receptor substrate,
 (d) optionally, subjecting the colloidal, elemental metal coated donor or receptor substrate to an electroless metal plating solution to provide a second elemental metal coating which is electrically conductive on said substrate.

21 Claims, No Drawings

THERMAL MASS TRANSFER OF METALLIC IMAGES

This is a continuation-in-part of application Ser. No. 07/283,596, filed Dec. 13, 1988, now U.S. Pat No. 4,892,798.

BACKGROUND OF THE INVENTION

1. Field of the Invention

The present invention relates to a toner fluid composition. In another aspect, there is disclosed a process for electrophoretically depositing particles of the toner fluid to provide coatings or patterns on a substrate. In a further aspect, a method is provided for enhancing the coatings or patterns to make them electrically conductive. In a yet further aspect, there is provided a process for thermal mass transfer of metallic images and articles comprising these images.

2. Description of the Background Art

Liquid developers or toners are commonly used in electrophoretic development, particularly for applications where high image resolution is desired. When an exposed electrographic film bearing a latent, electrostatic charge image of a polarity opposite to that of the dispersed pigment particles contacts the toner fluid, the particles migrate to and deposit upon the image, a process known as electrophoretic development Toner fluids are typically comprised of finely ground pigment particles dispersed in an insulating, organic carrier liquid with charge control agents and/or surfactants added to impart electrostatic charge and provide steric stabilization to the particles toward flocculation.

Latent charge images can be formed using a variety of electrographic processes including: (1) light or X ray exposure of an electrostatically charged photoconductor, (2) electrical discharge resulting from application of a high voltage between a stylus and a conductive support covered with a dielectric receptor, (3) ion projection, (4) electron beam printing, or (5) corona discharge through a metallic mask, etc.

Liquid developers or toners must satisfy a number of requirements; in particular, the concentration of excess ions must be very low to prevent competition between charged toner particles and ions of the same polarity for development of the latent electrostatic image. Volume resistivities greater than $10^{12}$ ohm.cm for the pure carrier liquid are normally required; hydrocarbon and halogen-substituted hydrocarbon liquids are commonly employed. Other factors, such as low dielectric constant (less than 3.5), low viscosity and convenient melting point and boiling point of the medium, colloidal particles with high charge-to-mass ratios and mobilities, small particle size, adhesion of the colloidal particles to the substrate, and stability toward flocculation are also important.

Typical particle compositions include pigments such as phthalocyanine blue, monolite red R.S., nigrosene, zinc oxide, and carbon black as well as a number of colored resin composites (i.e. latexes). For a more detailed description of liquid toners and the liquid electrophoretic development process, see R. M. Schaffert, "Electrophotography", The Focal Press, New York, N.Y., pages 562-574 (1975).

Chemical methods of producing colloidal metal dispersions via metal salt reduction are well established, but entail use of aqueous or polar organic media (high conductivity and dielectric constant). In addition, reductive methods neccesarily produce ionic byproducts which further increase the conductivity of the liquid medium. A recent review dealing with the history, preparation, structural features and properties of aqueous colloidal gold dispersions is given by J. Turkevich in J. Gold Bull. 18, 86-91 and 125-131 (1985). Reductive methods of preparing colloidal metal dispersions in alcohol or alcohol/water mixtures are described by H. Hirai, et. al. in J. Macromol. Sci.-Chem. A13, 633-649 and 727-750 (1979).

Metal evaporation techniques for the production of stable colloidal metal dispersions in polar organic liquids without added surfactants have been described by Klabunde, K. et al. in Proc. SPIE-Int. Soc. Opt. Eng. 821, 206 (1988); Klabunde, K. et al., Langmuir 2, 259-260 (1986); Klabunde, K. et al. ACS Symposium Series, 333 (High Energy Processes Organomet. Chem.) 246-59 (1987); Klabunde, K. et al., Langmuir 3, 986-992 (1987); and by Kimura et. al. in Bull. Chem. Soc. Jpn. 56, 3578-3584 (1983) and 57, 1683-1684 (1984). Electrophoretic mobility studies have established that dispersed metal particles in these polar media are electrostatically charged. Although the charging mechanism is uncertain, the electrostatic repulsion between particles is thought to play an important role in stabilizing the dispersions. Unlike dispersions prepared by reductive methods, the evaporative techniques produce no ionic byproducts. However, conductivities and dielectric constants of polar organic liquids are outside the useful range for toner fluids. Similarly prepared dispersions in nonpolar hydrocarbon media undergo rapid flocculation and settling.

Ozin and Andrews in J. Phys. Chem., 90, 2929-2938 (1986) disclose colloidal silver dispersions formed in liquid polyolefins such as poly(butadiene), poly(isoprene) and squalene using metal evaporation techniques.

Magnetic ferrofluids consisting of surfactant-stabilized dispersions of colloidal, ferromagnetic metal or metal oxide particles have been prepared in aqueous media as well as in polar and nonpolar organic liquids. A variety of methods, including prolonged grinding, precipitation, thermal or photochemical decomposition of metal carbonyls and metal evaporation techniques has been used in the preparation of these magnetic dispersions. [See N. Buske, et al. Colloids and Surfaces 12, 195-202 (1984); J. Shimoiizaka, et al. Fine Part. Process., Proc. Int. Symp., Somasundaran, P. Ed., AIME: New York 1980, pp. 1310-1394; E. Papirer, et al. J. Colloid and Interface Sci. 1983, 94, 207-219 and 220-228; M. Kilner, et al. IEEE Transactions on Magnetics 1984, 20, 1735-1737; S. R. Hoon, et al. J. Magn. Magn. Mater. 1983, 39, 107-110; U.S. Pat. No. 4,576,725; U.S. Pat. No. 4,599,184; I. Nakatani, et al. J. Magn. Magn. Mater. 65, 261-264 (1987)].

Magnetic developers for xerography have been patented (U.S. Pat. Nos. 4,252,671 and 4,252,672) which consist of colloidal elemental iron particles dispersed in organic liquid media and stabilized by an active or passive polymer which is bound to the particle surface. Use of these materials as developers is based, as in the case of ferrofluids, on the magnetic properties of the dispersed iron particles and their mobility in a magnetic field. A patent covering dispersions of chromium, molybdenum, and tungsten useful for the preparation of supported catalysts or optical recording media is U.S. Pat. No. 4,252,675. In yet another disclosure, U.S. Pat. No. 4,245,026 describes magnetically responsive toner particles comprised of a low density, imbibitive polymer particle impregnated within the pores of the polymer with iron, cobalt, nickel or their respective oxides.

Thermal mass transfer of vapor deposited metallic images from a donor to receptor has been disclosed, for example, in U.S. Pat. Nos. 4,800,397, 4,800,395, and in OEP (Office Equipment and Products), September, 1988, pages 58 to 60.

SUMMARY OF THE INVENTION

Briefly, the present invention provides a toner fluid comprising electrostatically charged, colloidal elemental metal particles dispersed in an electrically nonconductive organic carrier liquid of low dielectric constant and a soluble surfactant in sufficient concentration to charge and stabilize the colloidal metal dispersion. Preferably, the colloidal metal particles are nonferromagnetic, and more preferably they are noble metal particles.

In another aspect, this invention relates to a process for electrophoretically depositing the colloidal metal particles of the toner fluid on a dielectric or photoconductive substrate to produce nonconductive, metallic coatings on the substrate surface in the form of continuous or discontinuous films which may be patterned images.

In a still further aspect, in the case of a catalytically active colloidal metal, the present invention relates to a process whereby the colloidal metal coated substrate, wherein the metal coating is continuous or discontinuous, is subjected to an electroless plating solution to induce selective, catalyzed, metal plating in the colloid coated areas to provide a second metal coating which is electrically conductive, thus imparting electrical conductivity to those areas.

More particularly, this invention provides a process comprising the steps:
(a) providing the toner fluid of the invention, and providing a dielectric or photoconductive substrate,
(b) electrophoretically depositing the charged, colloidal elemental metal particles of the toner fluid in a uniform or imagewise fashion on at least a portion of at least one surface of the substrate using standard electrographic techniques to provide an electrically nonconductive, colloidal, elemental metal coating thereon, and
(c) optionally, in the case of a catalytically active colloidal metal, subjecting the resulting colloidal elemental metal coated substrate to an electroless metal plating solution to induce selective metal plating on the colloidal elemental metal coated portions of the substrate surface, to provide a second elemental, metal coating on said portions of the substrate surface which is electrically conductive.

In yet another aspect, the present invention provides a process for thermal mass transfer of metallic images, preferably digitally generated metallic images, and articles comprising these images. The process involves imagewise transfer of metallic coatings from an initial substrate (donor substrate) to a thermoplastic receptor substrate by selective application of energy, preferably heat and pressure. Metallic coatings to be transferred may consist of an electrically nonconductive film of colloidal metal toner particles. When an electrically nonconductive film of colloidal metal particles is transferred it can, optionally, then be subjected to an electroless plating solution to induce metal plating on the transferred colloidal metal image. More particularly, this invention provides a process comprising the steps:
(a) providing the toner fluid of the invention, a dielectric or photoconductive substrate, and a thermoplastic receptor substrate,
(b) electrophoretically depositing the charged colloidal elemental metal particles of the toner fluid in a uniform or imagewise fashion on at least a portion of at least one surface of the dielectric or photoconductive substrate using standard electrographic techniques to provide a donor substrate bearing an electrically nonconductive, colloidal, elemental metal coating thereon;
(c) contacting the donor substrate surface bearing the metal coating with the thermoplastic receptor substrate, and transferring, by application of energy, said metal coating from said donor substrate to said thermoplastic receptor substrate, to provide a metallic image on said receptor substrate,
(d) optionally, subjecting the colloidal, elemental metal coated receptor substrate to an electroless metal plating solution to induce metal plating on the colloidal metal coated portions of the substrate surface and thus provide a second elemental metal coating which is electrically conductive, on said portions of the substrate surface.

Optionally, in a further step, the transferred electroless plated conductive image can be further treated in an electroplating bath to further enhance the thickness and electrical conductivity of the image with the same or different metal, the method being known in the art. Preferred metals for electroplating include Cu, Ni, Cr, Co, Au, and Ag, although a variety of metals can be useful.

In yet a further aspect, the present invention provides a process for thermal mass transfer of metallic images. This process involves imagewise transfer of metallic coatings from an initial substrate (donor substrate) to a thermoplastic receptor substrate by the selective application of energy, preferably heat and pressure. Metallic coatings to be transferred may consist of an electrically conductive metal film derived from electroless plating of a colloidal metal-coated donor with a second or same metal. More particularly, this invention provides a process comprising the steps:
(a) providing the toner fluid of the invention, a dielectric or photoconductive substrate, and a thermoplastic receptor substrate,
(b) electrophoretically depositing the charged colloidal elemental metal particles of the toner fluid in a uniform or imagewise fashion on at least a portion of at least one surface of the dielectric or photoconductive substrate using standard electrographic techniques to provide a donor substrate bearing an electrically nonconductive, colloidal, elemental metal coating thereon;
(c) subjecting the colloidal, elemental metal coated donor substrate to an electroless metal plating solution to induce metal plating on the colloidal metal coated portions of the substrate surface and thus provide a second elemental metal coating which is electrically conductive on said portions of the substrate surface, and
(d) contacting the donor substrate surface bearing the metal coating with the thermoplastic receptor substrate, and transferring, by application of energy, said metal coating from said donor substrate to said thermoplastic receptor substrate, to provide a conductive metallic image on said receptor substrate.

Optionally, in a further step, the transferred conductive metal image can be further treated in an electroless or electroplating bath to further enhance the thickness and electrical conductivity of the image with the same or different metal, the method being known in the art. Preferred metals for electroless plating or electroplating include Cu, Ni, Cr, Co, Au, and Ag, although a variety of metals can be useful. Stable dispersions of electrostatically charged, colloidal elemental metal particles in liquid media of suitably low conductivity and dielectric constant have not previously been available for use as liquid toners in electrophoretic coating or imaging. This is principally due to the lack of effective methods of preparing stable dispersions of the required composition.

Ferrofluids are known in the art. Their physical behavior and applications derive from the ferromagnetic properties of the dispersed particles and the extraordinary stability of the dispersions in a magnetic field enables the entire fluid to flow or become immobilized by an external magnetic field without irreversible flocculation. In contrast, physical behavior and utility of toner fluids relies on the electrostatic charge of the dispersed particles and their tendency to migrate and irreversibly flocculate in an external electric field, which, in turn, is strongly dependent on factors such as conductivity and dielectric constant of the medium. Despite certain similarities in composition, ferrofluid and toner fluid performance are expected to be mutually exclusive and dependent on the interplay of various factors including surfactant and particle composition, surfactant and particle loading, and the composition and physical properties of the medium.

In this application:

"electrophoretic" means relating to the migration of suspended particles in an electric field;

"toner fluid" or "liquid developer" or "liquid toner" means a dispersion of small, charged particles in a fluid medium, which respond to an electrostatic field in such a way as to make them useful in electrophoretic coating and imaging;

"dispersion" means a two phase system where one phase consists of small solid particles (i.e. in the colloidal size range, 1-100 nm) preferably 2 to 50 nm distributed throughout and suspended in a continuous, bulk, liquid phase;

"metal" means Periodic Table main group metals, transition metals, noble metals, rare earth metals, and metalloids;

"stable" means that no more than 10 percent of the particles in the colloidal dispersions settle over a period of 1 week under ambient conditions of 25° C. and 1 atmosphere pressure (760 Torr);

"electrically nonconductive", when it refers to the organic carrier liquid, means that the pure liquid has a volume resistivity greater than $10^{12}$ ohm.cm;

"electrically conductive", when it refers to the metallic coatings, means that the conductivity of the coatings is greater than $10^4$ $(ohm.cm)^{-1}$;

"electrically nonconductive", when it refers to the metallic coatings, means that the conductivity of the coatings is at most $10^4$ $(ohm.cm)^{-1}$;

"low dielectric constant" means a value less than 3.5 and preferably less than 2.5 at 25° C. and 1 kHz;

"surfactant" means a surface active agent or dispersing agent or charge control agent which interacts with the surface of the dispersed particles to provide electrostatic charge and in some cases steric stabilization;

"substrate" means a material upon which a metallic coating is deposited or image is developed;

"dielectric substrate" as used herein means a substrate that does not conduct electricity, and also includes semiconductive substrates which are weakly conductive such as silicon, germanium, gallium arsenide, zinc telluride, selenium, tellurium, and the like;

"image" or "patterned image" means a reproduction or representative reproduction of some original pattern of lines and/or shapes;

"liquid medium" or "carrier liquid" means an organic liquid used to disperse the colloidal metal particles of the invention;

"soluble surfactant" means at least 1 milligram of surfactant dissolves in 100 mL of the chosen organic carrier liquid;

"without appreciable flocculation" means the number average particle size as measured by photon correlation spectroscopy increased by at most a factor of 10, preferably a factor of 5, and most preferably a factor of 2, over a period of 3 months at a temperature of 25° C. and 1 atmosphere pressure; and "thermal mass transfer" means tralsfer of metal by any means involving energy, such as heat and pressure, wherein heat can be generated by resistive heating, electromagnetic radiation absorption including laser, microwave energy, piezoelectric energy, and the like.

Toner fluid compositions of this invention represent a departure from the background art in that the dispersed phase consists of elemental metal particles in the colloidal size range. Unlike the traditional pigment particles used in toner fluids solely for graphics applications, colloidal elemental metal particles offer unique catalytic, electrical, magnetic, optical and biological properties which form the basis for novel application concepts for coated substrates in a host of different areas.

DETAILED DESCRIPTION AND SPECIFICATION OF THE INVENTION

The present invention provides unique toner fluid compositions useful for the electrophoretic production of metallic coatings and images. Toner fluids are comprised of electrostatically charged, essentially pure, elemental, colloidal metal particles dispersed in a nonconductive, organic carrier liquid of low dielectric constant and a soluble surfactant in sufficient concentration to charge and stabilize the colloidal metal dispersion. Generally the metallic toner particles are negatively charged, but in certain instances they are positively charged. Volume resistivity of the final toner fluid dispersion is preferably greater than $10^9$ and more preferably greater than $10^{10}$ ohm.cm.

For preparing the colloidal metal dispersions of the present invention, known apparatus may be employed for generating metal vapors which can be atomic metal vapors or a gaseous stream containing colloidal metal particles and contacting them with a dilute solution of the surfactant in an organic carrier liquid. Specifically, the gas evaporation reactor (GER) as described in U.S. patent application Ser. No. 07/125,600 has proven to be particularly useful for this purpose. Other reactor designs, such as the Klabunde-style static reactor or a rotary reactor of the Torrovap ™ design (Torrovap Industries, Markham, Ontario, Canada) may also be useful in certain instances, but are limited, by comparison, in the scope of their utility. A complete description of the three basic reactor designs and their use in the preparation of colloidal metal dispersions is given in U.S. patent application Ser. No. 07/125,600.

The variety of metals which can be used to prepare the stable colloidal dispersions of this invention includes transition metals, noble metals and the rare earth metals and includes metalloids, for example, aluminum and antimony, and main-group metals. Stable, colloidal metal dispersions can be prepared from a large number of metals selected from elements of atomic numbers 11–106. More important metals in order of their atomic numbers are: aluminum, scandium, titanium, vanadium, chromium, manganese, iron, cobalt, nickel, copper, zinc, gallium, germanium, yttrium, zirconium, niobium, molybdenum, technetium, ruthenium, rhodium, palladium, silver, cadmium, indium, tin, antimony, lanthanum, gadolinium, hafnium, tantalum, tungsten, rhenium, osmium, iridium, platinum, gold, thallium any lead. Non-ferromagnetic metals important for purposes of this invention include: copper, gold, iridium, palladium, platinum, rhodium, silver, rhenium, ruthenium, osmium, indium, tin and lead.

Colloidal elemental metal particles of this invention may be comprised of a single metal or combinations of two or more metals. Mixed metal compositions may be produced in a number of ways, including simultaneous or sequential metal evaporation from multiple evaporation sources or evaporation of metal alloys from a single source.

Each of the colloidal elemental metal particles of toner fluids of the present invention has a metal core which is more than 99 weight percent, preferably more than 99.5 weight percent pure metal. The metal core is usually crystalline, but may be amorphous depending upon the conditions used in its preparation. The elemental metal core may be surrounded by a thin surface coating of metal oxide or metal salt formed by surface oxidation of the elemental metal in air or by a component of the liquid medium. When present, the metal oxide or salt coating can account for less than 20 mole percent, preferably 10 mole percent, most preferably 5 mole percent, of the total metal content (metal plus metal oxide or salt). In many cases, the particles are essentially free of any oxide or metal salt coating. The extent of the oxide (or salt) layer, when present, will depend on the ease of oxidation of the particular elemental metal and the sample history (i.e., degree of air exposure). Chemically or physically adsorbed surfactant can form an extreme outer layer on the particles. Such a layer is generally associated (i.e., chemically or physically adsorbed) with the metal particles of the present invention. A layer of surfactant on the metal particles serves to charge the particles in the dispersion and may also provide steric stabilization of the metal particle dispersion toward flocculation. The surfactant and oxide or salt layers may be continuous or non-continuous.

Size and distribution of the colloidal elemental metal particles is similar for all of the evaporation techniques employed; particle sizes ranging from 1 to 100 nm, but more commonly from 2 to 50 nm have been identified by electron microscopy. Most preferably, a mean particle size of 10 nm with a standard deviation of 1 to 6 nm is achieved, preferably with a standard deviation less than 4 nm, as determined by a combination of electron microscopy and photon correlation spectroscopy. The small particle size and narrow distribution provides high resolution in electrographic imaging.

Limits on the maximum metal loadings in the toner fluid dipersions are dependent upon the concentration of surfactant in the organic carrier liquid. Limitations exist due to instability of the dispersions toward particle aggregation or flocculation at high metal concentrations At the low surfactant concentrations most commonly employed (0.01 to 1.0 g/100 ml of carrier liquid) in toner fluids of this invention, metal loadings up to 1.0% by weight in the organic carrier liquid, preferably in the range of 0.001 to 0.1% by weight, have been achieved without appreciable flocculation of the dispersion over a period of months at room temperature under ambient conditions.

Suitable organic carrier liquids useful in preparing toner fluid dispersions of this invention must fulfill the normal requirements of high volume resistivity and low dielectric constant previously established for other liquid toners used in electrophoretic development. Although firm limits have not been established, volume resistivities greater than $10^{12}$, preferably greater than $10^{13}$, and most preferably greater than $10^{14}$ ohm.cm, and dielectric constants less than 3.5, and preferably less than 2.5, are acceptable. Furthermore, it is preferred that the carrier liquid have a melting point of at most 15° C., and a boiling point between 60–300° C. at 1 atmosphere pressure and a viscosity less than 5 centipoise at 25° C. Classes of liquid media which satisfy these criteria and which can be employed as carriers in toner fluid applications in the present invention include: straight-chain, branched-chain, and cyclo-aliphatic hydrocarbons such as petroleum oils, naphtha, ligroin, hexane, pentane, heptane, octane, isododecane, isononane and cyclohexane; aromatic hydrocarbons such as benzene, toluene and xylene; and halocarbon liquids such as 1,1,2-trichloro1,2,2-trifluoroethane, trichloromonofluoromethane and carbon tetrachloride. Organic carrier liquids particularly useful in preparation of toner fluid dispersions of this invention, because of their high purity, high volume resistivity, low dielectric constant, low viscosity, and convenient boiling range are the isoparaffinic hydrocarbons Isopar ™ G (b.p.=156–176° C.) and Isopar ™ M (b.p.=207–254° C.) (Exxon Company USA, Houston, Tex.).

Utility of colloidal metal dispersions of this invention as toner fluids for electrophoretic development relies on the electrostatic charge associated with the suspended metal particles and consequent mobility of the particles in an electric field. Particle charging arises from the addition of surface active agents (surfactants). According to present theory, surfactants interact chemically with dispersed metal particles, causing specific adsorption of ions at the particle surface. In toner fluid media of low dielectric constant and low ion concentration, specific ion adsorption from added surfactants is believed to be the principle charge control mechanism. In addition to providing electrophoretic mobility, the electrostatic charge on particles also stabilizes the dispersions toward flocculation through mutual electrostatic repulsion of particles of like charge. In the case of high molecular weight surfactants, surface adsorbed species may also provide steric stabilization of dispersions. Since the detailed mechanism of charge control in liquid toners is not well established and depends to a large degree on the particle surface composition, no definitive rules regarding choice of surfactant are available.

Surfactant compositions found to be effective as charge control agents in toner fluid dispersions known in the art include natural and synthetic materials and combinations thereof which can be neutral or ionic. Natural materials include triglycerides such as linseed oil and soybean oil, and fatty acids such as linoleic acid, linolenic acid, oleic acid, and their combinations. Synthetic surfactants generally provide superior toner fluid stability and performance; these may include homopolymers and copolymers of vinyl-containing monomers such as: N-vinylpyrrolidone, vinylalcohol, styrene, vinyltoluene, vinylpyridine, acrylates (i.e. methylmethacrylate); block, graft or random copolymers such as those comprised of the following monomer combinations: styrene-butadiene, vinylchloride-vinyl ether, methacrylic acid ester-N-vinylpyrrolidone, fatty acid-methacrylate ester, styrene-allyl alcohol and alkylacrylate-styrene-butadiene; polyesters of carboxylic acids (i.e. polydecamethylene sebacate, alkyd resins); epoxy resins and phenolic resins (i.e. Novolaks); functionally terminated homopolymers such as: epoxide or amine-terminated polyolefins; ionic surfactants such as: copper oleate, Aerosol TM OT (sodium dioctylsulfosuccinate), triisoamylammonium picrate and aluminum octoate and mixtures or combinations thereof. Other commercially available charge control agents useful in the art are given in R. M. Shaffert, "Electrophotography" (supra), pages 71, 72.

Specific surfactants found useful in producing toner fluid dispersions of the present invention include epoxide terminated polyisobutylenes: Actipol TM E6, E16, and E23 (Amoco Chemical Co., Chicago, Ill.); commercial oil additives: Lubrizol TM 6401 and Lubrizol TM 6418 (The Lubrizol Corporation, Wickliffe, Ohio), AMOCO TM 9250 (AMOCO Petroleum Additives Company, Naperville, Ill.), and OLOA TM 1200 (Chevron Chemical Company, San Francisco, Calif.); and hydrocarbon compatible hyperdispersants such as Solsperse TM 17,000 (ICI Americas Inc., Wilmington, Del.). OLOA 1200, a low molecular weight polyisobutylene attached to a diamine head group by a succinimide linkage, is the preferred surfactant because of the stability and performance it imparts to the resulting toner fluids.

Concentration of surfactant used in preparing colloidal metal dispersions can have a dramatic influence on toner fluid performance. Surfactant concentration levels that are too low result in inadequate stability toward flocculation, whereas excess surfactant can lead to high ion concentrations in the medium which reduce the speed and efficiency of the development process. In general, surfactant concentrations between 0.001 and 10.0 g/100mL based on the total fluid, but preferably between 0.01 and 1.0g/100mL, can be used to prepare toner fluid dispersions of this invention. With surfactant OLOA 1200, concentrations between 0.01 and 0.12 g/100 ml in Isopar M or G produced toner fluids; optimum developing speed and efficiency were attained at a level of 0.04 g/100 ml.

In another aspect of this invention, methods are provided for electrophoretically depositing the colloidal metal particles of the toner fluid on a dielectric or photoconductive substrate to produce uniform, nonconductive, metallic coatings on a substrate surface in the form of continuous films or patterned images. In the present invention, it was convenient to use substrates in the form of thin, 2-dimensional, planar sheet constructions, although alternative substrate constructions are possible. Suitable dielectric substrates include virtually any nonconductive or semiconductive organic or inorganic solid, particularly polymeric and ceramic materials readily fabricated into thin films or other appropriate constructions. Suitable photoconductive films may be of the organic or inorganic type, such as those described by R. M. Schaffert in "Electrophotography", The Focal Press, New York, N.Y., 1975, pp. 60–69, 260–396.

Examples of useful dielectric or photoconductive substrate compositions include dielectric polymers such as: Kapton TM polyimide (duPont de Nemours & Co. Inc., Wilmington, Del.), polypropylene and polyethylene terephthalate (PET); inorganic dielectric materials such as aluminum oxide, silica-based glasses, silicon, germanium, and gallium arsenide; and photoconductive film constructions such as: Kodak Ektavolt TM Recording Film SO-102 (Eastman Kodak Co., Rochester, N.Y.) and bis-5,5'-(N-ethylbenzo[a]carbazolyl)phenyl methane (BBCPM) based photoconductive films described in U.S. Pat. Nos. 4,337,305 and 4,356,244. One may use a wide range of alternative dielectric and photoconductive materials as the substrates in the present invention.

Electrophoretic deposition is achieved using known electrographic coating and imaging techniques. These generally involve first sensitizing or charging the substrate surface by, for example, deposition of positive or negative ions generated in a corona discharge, followed by development of charged areas of substrate via the electrostatic attraction of the oppositely charged particles of the toner fluid. Alternatively, an external electric field may be applied to drive charged toner particles to the substrate surface. A number of variations on these basic processes are known in the art, but all rely on mobility of electrostatically charged toner particles in an electric field to achieve controlled deposition of particles on the substrate surface. Coatings thus produced may be in the form of continuous films covering the entire substrate surface or patterned images. Patterned images are produced by selective charging of the substrate surface to form a latent electrostatic image followed by selective electrophoretic development of only the charged or uncharged areas.

For the purpose of this invention, standard electrophotographic equipment was used for producing colloidal metal coatings and patterned images on a variety of substrates. A particularly useful electrophotographic set-up consisted of the following components: (1) a corona-discharge unit for depositing charge on the substrate surface, (2) a projection exposure unit for generating a latent electrostatic image on a photoconductive substrate, and (3) an extrusion-type developing station for contacting the charged substrate with toner fluid of the invention and providing controlled colloidal metal deposition on the substrate surface through application of a potential bias. Representative methods of producing colloidal metal coatings or patterned images using this equipment are included in the examples which follow.

Density of colloidal metal particles in the coatings produced via electrophoretic deposition depends on a number of parameters including substrate film thickness, corona-charging potential, bias voltage applied to the developing station, and development time. In the case of transparent substrates, relative metal loadings in the coated areas were estimated from measured optical densities. For a fixed surface potential, metal loadings decreased with increasing substrate film thickness, thus limiting the practical scope of the process to dielectric or photoconductive substrates in which the dielectric or photoconductive layer is less than approximately 1270 micrometers (50 mil) thick and preferably less than 255 micrometers (10 mil) thick. At the highest metal loadings generated on ultrathin (6 micrometer) polyester film, colloidal metal coatings were still nonconductive according to two-probe resistance measurements indicating an absence of extended contacts between metallic particles.

In one of the preferred embodiments of this invention, colloidal metal particles were electrophoretically deposited on a BBCPM based photoconductive film construction described in U.S. Pat. No. 4,337,305, Example 26, in the form of high resolution, nonconductive, metallic images. High resolution imaging was achieved by first charging the entire surface of the photoconductor in a corona discharge and then selectively discharging the surface by exposure to a projected image of a high resolution target to form a latent electrostatic image. Development of the latent image under a controlled bias potential using the metallic toner fluid dispersion of the invention produced the corresponding colloidal metal image Nonconductive, metallic images with a resolution up to 240 line-pairs/mm or individual line widths of equal to or greater than 2.0 micrometers have been obtained Based on the average size of the colloidal metal particles (about 10 nm), resolution in the submicrometer range is expected to be feasible with more sophisticated electrophotographic equipment.

In yet another aspect of this invention, methods are provided for enhancing the electrophoretically deposited, nonconductive, colloidal metal coatings and images via electroless metal plating. In this process, immobilized colloidal metal particles function as catalysts for promoting electroless metal plating. Thus, electroless metal plating occurs selectively in those areas on the substrate surface where colloidal metal has been deposited. Enhanced coatings and images become completely metallized in the electroless plating process and exhibit excellent electrical conductivity. These coatings and images can have a total thickness in the range of 0.03 to 50 micrometers, preferably in printed circuit applications in the range of 1.0 to 20 micrometers. Furthermore, even at resolutions up to 150 line-pairs/mm, image enhancement and electrical conductivity is achieved with negligible resolution loss.

Colloidal metals known to be useful as catalysts for electroless plating include metals from Periodic Table Groups 8-11. Particularly useful in terms of their catalytic activity are the metals Cu, Ni, Ag, Au, Pt, and Pd. From the standpoint of a desirable combination of cost, stability (toward oxidation or flocculation), and catalytic activity, colloidal Pd appears to be the metal of choice in this application.

Electroless plating solutions useful in this process have been described in the prior art. These minimally consist of a solution of a metal salt and a reducing agent in aqueous or organic media. In an electroless plating process the metal in the metal salt is catalytically reduced to its elemental form and deposited as such. Salts of a variety of metals have been shown to be effective for this purpose. Particularly useful are aqueous electroless plating solutions of copper, nickel, and cobalt which are readily prepared or are available from a variety of commercial sources and are described in "Plating of Plastics with Metals" by J. McDermott, Noyes Data Corporation, Park Ridge, N.J., pp. 62, 94, 177 (1974).

In another aspect of this invention, methods are provided for metallic imaging using thermal mass transfer printing techniques. In this process, metallic coatings are transferred in an imagewise fashion from an initial substrate (referred to as the donor substrate) to a thermoplastic receptor substrate by application of energy. Metallic coatings to be transferred may consist of an electrically nonconductive film of colloidal metal toner particles or an electrically conductive metal film derived from electroless plating of the colloidal metal coated donor substrate with a second or same metal. In all cases of electroless plated images, the metallic image (which may be a line or dot such as in a half-tone image) is electrically conductive. The thermal mass transfer and electroless plating steps can be performed in either order.

Any of a number of available thermal printing techniques may be used in the thermal mass transfer metallic imaging process of this invention. In a preferred embodiment, thermal mass transfer metallic imaging is achieved using a digital printer equipped with a thermal mass transfer-type print head. Benefits of these printers in thermal mass transfer printing applications are described in U.S. Pat. No. 4,839,224. Using such a thermal printer, a metallic image can be produced by first positioning a metal coated donor substrate intermediate to a thermal print head and a thermoplastic receptor substrate. The thermal print head is activated to supply heat selectively to areas of the contacting donor/receptor sheets causing softening of, and physical bonding of metal to, the thermoplastic receptor in an image configuration. Subsequent separation of the substrates allows transfer of the metal to the areas of the receptor which have been addressed by the print head. A final radiation or thermal fusion step optionally may be used to further promote adhesion of the metallic images to the receptor.

Dimensions and physical properties of the donor and receptor substrate can be crucial to the effectiveness of the thermal mass transfer metallic imaging process and the quality of the final metallic images. Either the donor or receptor substrate is capable of transmitting energy to the donor-receptor interface.

Using thermal mass transfer-type print heads in which thermal energy is transmitted through the donor to the receptor, donor substrates preferably are thin in order to provide efficient heat transfer to the receptor. Such donor substrate thicknesses are generally less than 15 micrometers, preferably less than 9 micrometers, and most preferably less than 6 micrometers. Furthermore, the donor sheet composition should preferably be non-thermoplastic at the temperatures generated by the thermal print head (i.e. temperature of image transfer) to prevent sticking of the thermal print head and the metal coating to be transferred. The $T_g$ of the donor substrate preferably is greater than 50° C. Substrate materials that can be used in donor sheets of this invention include, but are not restricted to, cellophane, low porosity paper products, and polymeric resin films such as polyesters, polyimides, polyethylenes, polycarbonates, polystyrenes, polyvinylacetate, polyvinylalcohol, polyvinylethylene and polypropylenes. These substrates can be used in non-treated form or can be treated (as with grease, silicone, fluorocarbon) to prevent sticking by thermal heads, as is known in the art.

When using thermal mass transfer print heads, the receptor substrate may be a thermoplastic polymer film or substrate or may be comprised of a thermoplastic polymer coating on a supporting base. Thickness of the thermoplastic coating preferably is greater than 1 micrometer and preferably greater than 5 micrometers. In general, the glass transition temperature of the thermoplastic substrate can be between 0 and 200° C. and preferably between 20 and 150° C. Thermoplastic polymers that can be used in the receptor sheets of this invention include, but are not restricted to, polyesters such as Vitel TM PE 200 (Goodyear) and polyethylene terephthalate, nylons such as polyhexamethylene adipamide, polyethylenes (high and low density), polypropylenes, polyvinylchloride, polystyrenes, acrylic resins and copolymers of the above classes such as polyethyleneacrylic acid.

The thermal energy required to achieve thermal transfer of metallic images depends to a large degree upon the donor and receptor substrates used. Typically, a minimum print head energy required to achieve thermal mass transfer for a given donor/receptor combination is desired since this prolongs the life of the print head and minimizes thermal degradation of the polymer substrates. Generally the print head is operated at an energy of 1–10 J/cm$^2$ and preferably between 1.6–2.5 J/cm$^2$.

For direct thermal transfer of conductive metal images, thickness of the electroless plated metal coating on the donor substrate is also important. If too thin, the metal coating will not exhibit good electrical conductivity; if too thick, the cohesive strength of the metal coating will inhibit thermal mass transfer at low transfer energy. Electroless metal coatings, which contain the previously deposited colloidal metal particles, preferably range in thickness between 0.03–0.15 micrometers, and more preferably range between 0.05–0.08 micrometers, have been found to work well in the thermal mass transfer process of this invention.

The metal coatings of the present invention (colloidal and/or electroless plated) weakly adhere to the donor substrate. During transfer, it is required that adhesive forces between metal and donor be less than between metal and receptor. Also it is important that electroless plated metal coatings on donor substrates have sufficiently low cohesive strength within the metal coating to allow selective thermal transfer of the chosen image at low transfer energies.

Metal images and metal overplated images of the invention, which can be reflective or nonreflective, can be transferred using conventional heat and pressure (e.g., a thermal laminating process). Such a process can allow for greater variation in thickness of donor and receptor substrates.

Metallic toner fluid dispersions of the present invention can be used to prepare articles coated in a continuous or imagewise fashion with colloidal metal. Colloidal metal coatings appear continuous to the eye but when viewed with an electron microscope, discrete metal particles can be seen. Articles bearing the nonconductive, colloidal metal coatings can find applications in areas of catalysis (i.e. electroless plating), optical or magnetic recording and biomedical science. Electroless plated and electroplated articles in which the original colloidal metal coating has been enhanced and made electrically conductive can find applications in the electronics area as printed circuits or microcircuits or materials for static control. Other applications in the graphics reproduction area for producing metallized graphics or in optical devices for absorbing, reflecting or otherwise modulating various types of radiation are also forseen.

Objects, features and advantages of this invention are further illustrated by the following examples, but the particular examples and amounts thereof recited in these examples, as well as other conditions and details, should not be construed to unduly limit this invention. All organic carrier liquids in the Examples had volume resistivities greater than $10^{10}$ ohm.cm and dielectric constants less than 2.5.

EXAMPLE 1

This example describes a typical procedure for preparation of a colloidal metal dispersion in a nonconductive organic liquid medium of low dielectric constant containing a dissolved surfactant for application as a liquid toner in electrophoretic coating and imaging. Preparation of the dispersion was accomplished by metal evaporation and transfer into the liquid medium using a Gas Evaporation Reactor (GER).

In a GER equipped with a direct drive mechanical vacuum pump, gold metal was evaporated from a resistively heated, alumina coated, tungsten crucible into a stream of $N_2$ gas with a flow rate adjusted such that the internal reactor pressure was maintained at 10.0 torr. As the gold vapor was carried away from the crucible in the gas stream, metal clustering occurred to form colloidal gold particles. The stream of gold particles was bubbled through a solution containing 0.022 wt% OLOA 1200 surfactant in Isopar M at $-40°$ C. Gold particles captured by the solution formed a dark purple, transparent dispersion containing 0.024% gold by weight. The colloidal dispersion appeared to be indefinitely stable under ambient conditions with no noticeable settling or flocculation over a period of months. Analysis of the dispersion by photon correlation spectroscopy revealed a mean number average gold particle size of 10.0 nm with a standard deviation of 3.8 nm. Presence of colloidal gold was confirmed by transmission electron microscopy which showed highly crystalline particles with a primary particle size ranging from 4–21 nm. Conductivity of the final liquid dispersion was measured at $0.8 \times 10^{-11}$ (ohm.cm)$^{-1}$ Electrophoresis measurements indicated that the suspended gold particles were negatively charged with a zeta potential of $-230$ mV ($\pm 20\%$).

EXAMPLES 2-12*

The following samples were prepared by the method of Example 1 except that argon rather than nitrogen was used as the inert gas stream:

| Example Number | Colloidal Metal | weight percent | Surfactant | weight percent |
| --- | --- | --- | --- | --- |
| 2 | Au | 0.0183 | OLOA 1200 | 0.02 |
| 3 | Pd | 0.0201 | OLOA 1200 | 0.04 |
| 4 | Ni | 0.0039 | OLOA 1200 | 0.04 |
| 5 | Pt | 0.0012 | OLOA 1200 | 0.04 |
| 6 | Cr | <0.0100 | OLOA 1200 | 0.03 |
| 7 | Cu | <0.0100 | OLOA 1200 | 0.04 |
| 8 | Pd | <0.0100 | AMOCO 9250 | 4.0 |
| 9 | Pd | <0.0500 | LUBRIZOL 6418 | 0.03 |
| 10 | Pd | <0.0500 | LUBRIZOL 6401 | 0.03 |
| 11 | Ag | <0.0100 | AMOCO 9250 | 2.0 |

-continued

| Example Number | Colloidal Metal | weight percent | Surfactant | weight percent |
|---|---|---|---|---|
| 12 | Pd | 0.0052 | Actipol E6 | 0.5 |

*Average metal particle size determind by transmission electron microscopy and/or photon correlation spectroscopy ranged from 5 to 15 nm; carrier liquid was Isopar G.

EXAMPLE 13

This example describes a typical procedure for electrophoretic deposition of continuous colloidal metal coatings on a dielectic film substrate by application of an external electric field.

A 6 micrometer thick film of polyethylene terephthalate (PET), was adhered to a grounded aluminum plate by application of a thin layer of ethanol at the film-aluminum interface. The entire assembly was passed through an extrusion type developing station commonly used in liquid toner development using a colloidal gold dispersion in Isopar M (prepared as in Example 1) as the toner fluid. With the PET film in contact with the meniscus of the colloidal gold dispersion, a negative potential of 300 V was applied to the developing station such that the negatively charged gold particles were repelled and driven to the surface of the polymer film. A continuous colloidal elemental metal coating the width of the developing station was produced. PET surface potential after development was measured at −80 V with respect to the grounded plate. Increasing the developing voltage or the development time produced an increase in surface potential of the coated film and a more dense colloidal metal coating on the PET surface. However, even at the highest metal loadings, no electrical conductivity could be detected by two probe resistance measurements.

EXAMPLE 14

This example describes a typical procedure for electrophoretic deposition of continuous colloidal metal coatings on a dielectic film substrate by charging the substrate surface in a corona discharge.

A 6 micrometer thick film of PET was adhered to a grounded aluminum plate as in the previous example. The entire assembly was passed through a (+) DC corona discharge device in order to deposit a positive charge on the PET surface with an initial surface potential of 100 to 1000 V. Electrophoretic deposition of colloidal gold or palladium coatings was accomplished by contacting the charged surface with Isopar G dispersions of Examples 2 or 3 by passing the film assembly through the extrusion developing station at zero bias potential. This technique produced continuous colloidal metal surface coatings on the PET surface. Density of the colloidal metal coatings with increasing initial positive surface potential; however, none of the coatings exhibited measurable electrical conductivity.

EXAMPLE 15

This example describes a procedure for image-wise electrophoretic deposition of colloidal metal patterns on a dielectric film substrate at low resolution.

As in the previous example, a 6 micrometer thick film of PET was adhered to a grounded aluminum plate A high resolution, metallic, Air Force target with patterned cutouts was placed on top of the PET to mask the surface. The entire assembly was passed through a (+) 6000 volt DC corona discharge to deposit a latent positive charge pattern on the PET surface. After removing the metal mask, the charge pattern was developed by exposure to a colloidal gold dispersion in Isopar M (toner fluid prepared as in Example 1) either by spraying with toner fluid or passing through the extrusion type developing station as previously described. Selective deposition of negatively charged gold particles on the positivly charged pattern produced a nonconductive colloidal metal image. Maximum resolution was 4 lines/mm, the limit of the metal target.

EXAMPLE 16

This example describes a proceduce for production of high resolution colloidal metal images on a photoconductive substrate using standard electrophotographic techniques.

A film of BBCPM based organic photoconductor (prepared as in U.S. Pat. No. 4,337,305, Example 26) was adhered to a grounded aluminum plate and the surface of the photoconductor was charged with an initial surface potential of (+)700 V by passage under a corona discharge. Selective photodischarge to produce a latent positive charge pattern was accomplished by projecting a 24X reduced image of a high resolution target on the charged photoconductor surface using a projection exposure unit. The latent charge pattern was developed by contacting with a colloidal gold dispersion in Isopar G containing 0.022 wt % OLOA 1200 (prepared as in Example 2) using the extrusion developing station. Resolution of the final metallic images depended on the applied developing bias potential and varied from 150 line-pairs/mm at 0 volts to 240 line-pairs/mm at +200 volts. Further increase in the developing bias potential did not increase resolution, but decreased the optical density of the images. Metallic images were purple to grey and exhibited negligible conductivity according to 2-probe measurements.

EXAMPLES 17 and 18

These examples describe use of electrophoretically deposited metal colloids on dielectric or photoconductive substrate surfaces as immobilized catalysts for promoting selective electroless metal deposition and the production of electrically conductive metallic coatings and patterned images.

17. CONTINUOUS ELECTROLESS PLATING OF ALUMINA PLATE

A colloidal gold coating was deposited from an Isopar G dispersion (containing .022 wt% OLOA 1200 prepared as in Example 2) onto the surface of a 635 micrometer (25 mil) thick fused alumina plate according to the procedure described in Example 13. Bias potentials up to −5000 volts were used. The gold coating was metallic grey in appearance and nonconductive. Immersion of the plate in a commercial electroless copper plating solution, CUPOSIT TM 328 (Shipley Company Inc., Newton, Mass.), at room temperature for 20 minutes produced a metallic copper film on the colloidal gold-coated surface. No copper deposition occured on the gold-free surfaces. A 2-probe resistance of approximately 10.0 ohms indicated that the copper coating was electrically conductive.

18. HIGH RESOLUTION, IMAGE-WISE ELECTROLESS PLATING OF PHOTOCONDUCTIVE FILM

Colloidal gold line patterns with a maximum resolution of 150 line-pairs/mm were produced on a film of BBCPM photoconductor using the procedure described in Example 16. The initial images exhibited no measurable electrical conductivity. Immersion of the imaged film in a CUPOSIT 328 electroless plating solution for 20 minutes at room temperature resulted in selective copper plating in the colloidal metal coated areas. The final copper images displayed enhanced electrical conductivity (2 probe resistance=approximately 10 ohms) with no loss of resolution.

EXAMPLES 19 AND 20

These examples describe thermal mass transfer imaging techniques for producing conductive or nonconductive metallic images on a thermoplastic substrate. The methods involve thermal transfer of metal from the initial substrate (donor sheet) to a thermoplastic receptor substrate in an imagewise fashion. The metal to be transferred may be colloidal metal toner particles or a metal film derived from electroless plating of the colloidal metal-coated donor with a second metal.

19. IMAGE, THERMAL TRANSFER OF COLLOIDAL METAL

A donor sheet comprising a continuous, colloidal palladium coating on one surface of a 6 micrometer thick sheet of PET film was prepared by the method of Example 13 using the toner fluid of Example 3. Imagewise thermal transfer of colloidal palladium to a receptor sheet comprised of 100 micrometers thick PET coated with a 5 micrometer layer of thermoplastic Vitel TM PE 200 (Goodyear Corp.) was accomplished using a digital, thermal mass transfer printer equipped with an OKI (Tokyo, Japan) print head operating at 2.0 J/cm$^2$ with a resolution of 200 dpi (dots per inch) [8 dots per mm]. A mesh pattern consisting of two series of parallel lines intersecting at right angles was generated using a VAX TM (Digital Equipment Corp.) computer and stored in a mass memory device to control the thermal printer. The donor sheet was positioned in the printer intermediate to the thermal print head and the receptor sheet. The thermal print head was activated to supply heat selectively to areas of the contacting donor/receptor sheets causing localized softening of, and transfer of colloidal metal to, the thermoplastic receptor in the predefined image configuration. In this way, a colloidal palladium image of the computer-generated mesh pattern was reproduced on one surface of the receptor. The transferred palladium mesh pattern was clear and well defined with a resolution of 100 lpi (line-pairs per inch) [4 line-pairs per mm] but was electrically nonconductive (i.e. no bulk conductivity as determined by two-probe resistance measurements). An electrically conductive copper mesh pattern was produced by immersing the palladium image bearing receptor film in a CUPOSIT 328 plating solution for 2–3 minutes at room temperature. Resolution was similar to the palladium original. A final radiation fusion step was used to further promote the adhesion of the conductive pattern to the thermoplastic substrate. Alternatively, a final heated roller can be used.

20. IMAGEWISE, THERMAL TRANSFER OF PLATED METAL

A colloidal palladium coated donor sheet was prepared according to the methods of Example 19. The donor sheet was then electroless plated with copper by immersion in CUPOSIT 328 solution for 7 minutes at room temperature. The highly reflective, electrically conductive copper coating which results is approximately 0.15 micrometers thick judging from its optical density of 2.0. The copper plated PET film was used as a donor sheet for the thermal transfer of conductive copper images directly to a thermoplastic receptor comprised of 100 micrometers thick PET coated with a 10 micrometer layer of EAA (polyethylene-acrylic acid). Thermal transfer of metallic images was accomplished using a digital thermal mass transfer printer equipped with an OKI 200 dpi (8 dpmm) print head using the procedure described in Example 19. Operating the printer at a print energy of 2.4 J/cm$^2$ allowed clean transfer of electrically conductive copper images to the receptor with a resolution of 200 dpi (8 dpmm).

Various modifications and alterations of this invention will become apparent to those skilled in the art without departing from the scope and spirit of this invention, and it should be understood that this invention is not to be unduly limited to the illustrative embodiments set forth herein.

We claim:

1. A process for thermal mass transfer of a metallic image comprising the steps of:
   (a) providing
      (1) a toner fluid dispersion comprising electrostatically charged, colloidal elemental metal particles dispersed in an electrically nonconductive organic carrier liquid of dielectric constant less than 3.5 and having a volume resistivity greater than $10^{12}$ ohm.cm, and an amount of a soluble surfactant effective to charge and stabilize said dispersion, said metal particles having sizes in the range of 1 to 100 nm,
      (2) a dielectric or photoconductive substrate, and
      (3) a thermoplastic receptor substrate,
   (b) electrophoretically depositing the charged colloidal elemental metal particles of the toner fluid in a uniform or imagewise fashion on at least a portion of at least one surface of the dielectric or photoconductive substrate using standard electrographic techniques to provide a donor substrate bearing an electrically nonconductive, colloidal, elemental metal coating thereon,
   (c) contacting said dielectric or photoconductive substrate surface bearing said metal coating with said thermoplastic receptor, and transferring, by application of energy, said metal coating from said dielectric or photoconductive substrate to said thermoplastic receptor substrate, to provide a metallic image on said receptor substrate.

2. The process according to claim 1 further comprising the step of subjecting said colloidal, elemental metal coated receptor substrate to an electroless metal plating solution to induce metal plating on the colloidal metal coated portions of the substrate surface and provide a second elemental metal coating which is electrically conductive, on said portions of the substrate surface.

3. The method according to claim 2 further comprising the step of treating said transferred electroless plated metal image in an electroplating bath to enhance the thickness and electrical conductivity of the image by further deposition of the same or different metal.

4. The process according to claim 1 wherein said colloidal metal particles are selected from the group consisting of iron, nickel, cobalt, aluminum, scandium, titanium, vanadium, chromium, manganese, copper, zinc, gallium, germanium, yttrium, zirconium, niobium, molybdenum, technetium, ruthenium, rhodium, palladium, silver, cadmium, indium, tin, antimony, lanthanum, hafnium, tantalum, tungsten, rhenium, osmium, iridium, platinum, gold, thallium and lead.

5. The process according to claim 1 wherein said colloidal metal particles are selected from the group consisting of copper, gold, iridium, palladium, platinum, rhodium, silver, rhenium, ruthenium, osmium, indium, tin, and lead.

6. The process according to claim 1 wherein said colloidal metal particles are palladium.

7. The process according to claim 1 wherein said colloidal metal particles are platinum 8. The process according to claim 1 wherein said substrate of step (a)2 is dielectric.

9. The process according to claim 1 wherein said substrate of step (a)2 is photoconductive.

10. The process according to claim 1 wherein said substrate of step (a)2 is polymeric.

11. The process according to claim 1 for preparing an article comprising a substrate having on at least one surface thereof a continuous or patterned uniform nonconductive image of colloidal metal particles, said particles having sizes in the range of 1 to 100 nm.

12. A process for thermal mass transfer of a metallic image comprising the steps of:
    (a) providing
        (1) a toner fluid dispersion comprising electrostatically charged, colloidal elemental metal particles dispersed in an electrically nonconductive organic carrier liquid of dielectric constant less than 3.5 and having a volume resistivity greater than $10^{12}$ ohm.cm, and an amount of a soluble surfactant effective to charge and stabilize said dispersion, said metal particles having sizes in the range of 1 to 100 nm,
        (2) a dielectric or photoconductive substrate, and
        (3) a thermoplastic receptor substrate,
    (b) electrophoretically depositing the charged coloidal elemental metal particles of the toner fluid in a uniform or imagewise fashion on at least a portion of at least one surface of the dielectric or photoconductive substrate using standard electrographic techniques to provide a donor substrate bearing an electrically nonconductive, colloidal, elemental metal coating thereon;
    (c) subjecting the colloidal elemental metal to an electroless metal plating solution to induce metal plating on the colloidal metal coated portions of the substrate surface and thus provide a second elemental metal coating which is electrically conductive, on said portions of the substrate surface, and
    (d) contacting said dielectric or photoconductive substrate surface bearing said metal coating with said thermoplastic receptor, and transferring, by application of energy, said metal coating from said dielectric or photoconductive substrate to said thermoplastic receptor substrate, to provide a metallic image on said receptor substrate.

13. The process according to claim 12 further comprising the step of treating said transferred metallic image in an electroless plating or electroplating bath to enhance the thickness and electrical conductivity of the image by further depositioin of the same or different metal.

14. The process according to claim 12 wherein said colloidal metal particles are selected from the group consisting of iron, nickel, cobalt, aluminum, scandium, tianium, vanadium, chromium, manganese, copper, zinc, gallium, germanium, yttrium, zirconium, niobium, molybdenum, technetium, ruthenium, rhodium, palladium, silver, cadmium, indium, tin, antimony, lanthanum, hafnium, tantalum, tungsten, rhenium, osmium, iridium, platinum, gold, thallium and lead.

15. The process according to claim 12 wherein said colloidal metal particles are selected from the group consisting of copper, gold, iridium, palladium, platinum, rhodium, silver, ruthenium, osmium, indium, tin, and lead.

16. The process according to claim 12 wherein said colloidal metal particles are at least one of palladium and platinum.

17. The process according to claim 12 wherein said substrate of step (a)2 is dielectric.

18. The process according to claim 12 wherein said substrate of step (a)2 is photoconductive.

19. The process according to claim 12 wherein said substrate of step (a)2 is polymeric.

20. The process according to claim 12 wherein said dielectric or photoconductive substrate has a $T_g$ greater than 50° C.

21. The process according to claim 12 for preparing an article comprising a substrate having on at least one surface thereof a continuous or patterned uniform nonconductive image of colloidal metal particles, said particles having sizes in the range of 1 to 100 nm.

* * * * *

UNITED STATES PATENT AND TRADEMARK OFFICE
CERTIFICATE OF CORRECTION

PATENT NO. : 4,985,321

DATED : January 15, 1991

INVENTOR(S) : Hsin-Hsin Chou et al.

It is certified that error appears in the above-identified patent and that said Letters Patent is hereby corrected as shown below:

Col. 4, line 42, "electricallY" should be --electrically--.

Col. 4, line 43, "platin9" should be --plating--.

Col. 7, line 23, "any" should be --and--.

Col. 14, line 11, "$10^{10}$" should be --$10^{14}$--.

Col. 20, line 3, after "metal" insert --coated dielectric or photoconductive substrate--.

Col. 20, line 21, "depositioin" should be --deposition--.

Signed and Sealed this

Twenty-first Day of July, 1992

Attest:

DOUGLAS B. COMER

*Attesting Officer*   *Acting Commissioner of Patents and Trademarks*